(12) United States Patent
Hisaka

(10) Patent No.: US 7,119,414 B2
(45) Date of Patent: Oct. 10, 2006

(54) FUSE LAYOUT AND METHOD TRIMMING

(75) Inventor: Katushiko Hisaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 69 days.

(21) Appl. No.: 10/752,542

(22) Filed: Jan. 8, 2004

(65) Prior Publication Data

US 2004/0224444 A1    Nov. 11, 2004

(30) Foreign Application Priority Data

Jan. 9, 2003    (JP) ............................. 2003-002824

(51) Int. Cl.
*H01L 29/00* (2006.01)

(52) U.S. Cl. ..................................................... 257/529

(58) Field of Classification Search ................ 257/209, 257/529, 530; 438/132, 467, 601, 131, 600
See application file for complete search history.

(56) References Cited

U.S. PATENT DOCUMENTS

| | | | | |
|---|---|---|---|---|
| 3,930,304 A | * | 1/1976 | Keller et al. ..................... | 438/6 |
| 5,341,267 A | * | 8/1994 | Whitten et al. ................ | 361/56 |
| 5,381,034 A | * | 1/1995 | Thrower et al. ............. | 257/529 |
| 5,493,148 A | * | 2/1996 | Ohata et al. ................. | 257/538 |
| 5,682,049 A | * | 10/1997 | Nguyen ........................ | 257/363 |
| 5,886,392 A | * | 3/1999 | Schuegraf .................... | 257/530 |
| 6,054,330 A | * | 4/2000 | Phipps et al. ................... | 438/3 |
| 6,093,954 A | * | 7/2000 | Yoshikuni .................... | 257/529 |
| 6,188,092 B1 | * | 2/2001 | Hatano et al. .............. | 257/229 |
| 6,232,823 B1 | * | 5/2001 | Tsuchida ..................... | 327/525 |
| 6,373,772 B1 | * | 4/2002 | Kato et al. ................ | 365/225.7 |
| 6,507,053 B1 | * | 1/2003 | Bernard et al. ............. | 257/209 |
| 6,518,824 B1 | * | 2/2003 | McCollum .................. | 327/525 |
| 6,548,884 B1 | * | 4/2003 | Oikawa ...................... | 257/529 |
| 6,858,916 B1 | * | 2/2005 | Sakoh ......................... | 257/530 |
| 2001/0042897 A1 | * | 11/2001 | Yeh et al. .................... | 257/529 |
| 2002/0038902 A1 | * | 4/2002 | Naiki .......................... | 257/529 |
| 2002/0185706 A1 | * | 12/2002 | Ikegami ...................... | 257/529 |
| 2003/0006466 A1 | * | 1/2003 | Kimura ...................... | 257/369 |
| 2004/0070054 A1 | * | 4/2004 | Naiki .......................... | 257/665 |
| 2004/0135229 A1 | * | 7/2004 | Sasahara ..................... | 257/529 |

FOREIGN PATENT DOCUMENTS

JP          9-36234          2/1997

* cited by examiner

*Primary Examiner*—Lex H. Malsawma
(74) *Attorney, Agent, or Firm*—Takeuchi&Kubotera,LLP

(57) ABSTRACT

A fuse layout (10) constructed of a wiring electrode made of a barrier metal layer of a high melting point and a main wiring metal layer comprises a plurality of fusion-type fuse sections (11 and 12) connected to each other in series and a plurality of fuse pads (13, 14, and 15) for drawing current to the respective fuse sections. If only one of the fuse sections is cut, the whole fuse layout is put in the "cut condition" so that the total fraction defective of incomplete cut of the fuse layout is largely reduced. Even if the barrier metal layer is not cut to remain, it has a high resistance so that the fuse resistance of the whole fuse layout becomes very high and the fuse layout is considered in the "cut condition".

14 Claims, 4 Drawing Sheets

FUSE LAYOUT AND METHOD TRIMMING

BACKGROUND OF THE INVENTION

1. Field of the Invention

This invention relates to a layout of a fuse integrally formed on a substrate with elements of a semiconductor device and a method of trimming.

2. Description of the Related Art

A fuse simultaneously formed with elements of a semiconductor device is used upon trimming for adjusting characteristics of the elements. Especially, in recent years, the fuse is used in a redundant circuit of a memory device to switch to a row or column of a spare circuit when a certain row or column of a main circuit is defective, thereby increasing production yield.

The fuse is not formed by individual process but generally formed with main elements in the process of producing electrodes of the semiconductor device. A fusion-type metal is usually used for the fuse, wherein the metal is cut or disconnected by drawing current or applying laser beam to the narrow portion of the metal. A short-circuited type fuse is also used, which has a capacitor structure where an insulating film is sandwiched by metals and broken down by application of voltage to make short-circuited between the metals.

The main stream of the conventional method has been using a single layer metal, such as aluminum (Al) and Copper (Cu), for electrode wiring of the semiconductor device. However, as the fine structure is required, in case of Al wiring, a two-layer electrode has become popular, wherein a conventional.wiring metal is formed on a thin lower layer made of a barrier metal, such as tungsten (W), titanium (Ti), and titanium nitride (TiN).

Japanese Patent Application Kokai Number 9-36234 discloses the structure of the fuse and manufacturing method thereof.

In the conventional method of cutting the fusion-type fuse by drawing current, it was easy to cut the electrode wiring made of the single layer of Al. However, when the electrode has the two-layer structure including the lower layer of the barrier metal, although the main wiring metal of the upper layer is easily cut, the thin barrier metal is prone not to be completely cut because the barrier metal has a relatively high resistance which does not permit large current to be drawn to the barrier metal.

It is difficult to apply higher voltage between the fuses due to adverse influences on the elements. Thus, when the barrier metal is not cut completely and remains, it causes a characteristic failure and a leakage problem, resulting in decrease of the yield and reliability.

When the fuse is cut by applying laser beam, there is no problem caused by the two-layer structure of electrode. However, if the irradiation of laser beam is not accurate, the fuse is not cut completely and some metal remains at an end of the fuse, resulting in decrease of the yield and reliability because the irradiation of laser beam cannot be repeated at the same position.

BRIEF SUMMARY OF THE INVENTION

Accordingly, it is an object of this invention to provide a new and improved fuse layout and a method of trimming, capable of decreasing the failure of element caused by the remaining fuse, resulting in increase of the yield and reliability and decreasing the working time for the trimming process.

According to an aspect of the present invention, there is provided a fuse layout constructed of a wiring electrode of main elements made of a barrier metal layer of a high melting point and a main wiring metal layer, wherein the fuse layout comprises a plurality of fusion-type fuse sections connected to each other in series and a plurality of fuse pads for drawing current to the respective fuse sections.

Also, there is provided a trimming method using the above-described fuse layout, wherein the trimming method comprises the step of cutting the fusion-type fuse sections by applying a voltage between the fuse pads to draw current to the respective fuse sections.

In the layout of the fuse including a plurality of fuse sections connected to each other in series, if only one of the fuse sections is completely cut, it means that the whole fuse layout is cut so that the fraction defective is largely reduced compared with the fuse layout including only one fuse section.

It is preferred that the barrier metal layer is a thin film formed under the main wiring metal layer so that the barrier metal layer has a high resistance. In that case, even if all of the fuse sections remain, the fuse resistance value of the whole layout becomes very high because each resistance value of the fuse section is added. Accordingly, the fuse layout is considered in the same as the "cut condition".

In case of the fusion-type fuse section, after the characteristic test by a probing apparatus is performed, the fuse section is cut by drawing current to the fuse section through the probing apparatus, and then the characteristic test is performed again by the probing apparatus. That means that the series of the above process can be performed by a single probing apparatus. Accordingly, the trimming time by drawing current is shorter than that by irradiation of laser beam which requires the movement of the device every time the fuse cutting and characteristic test are performed.

It is preferred that a leading section having a medium size is provided for connecting the fusion-type fuse section which is narrow and the fuse pad which is large, to avoid pattern forming error and concentration of electric field.

According to another aspect of the invention, there is provided a fuse layout including a plurality of fusion-type fuse sections connected to each other in series, and a trimming method comprising the step of cutting the fusion-type fuse sections by application of laser beam.

The cutting by application of laser beam does not require the fuse pads for drawing current, which enables the size of elements in the fuse layout to be small. In addition, the total fraction defective of the incomplete cut caused by inaccurate irradiation of laser beam is reduced by cutting the respective fusion-type fuse sections connected in series.

According to still another aspect of the invention, there is provided a fuse layout constructed of wiring electrodes and an insulating film sandwiched by the wiring electrodes, wherein the fuse layout comprises a plurality of short-circuited type fuse sections connected to each other in parallel and a plurality of pairs of fuse pads for drawing current to the respective fuse sections. Also, there is provided a trimming method using the above fuse layout, wherein the trimming method comprises the step of drawing current to the short-circuited type fuse sections by applying a voltage to the fuse pads to break down the insulating film.

Since the fuse sections are connected in parallel, if one of the plurality of fuse sections is short-circuited, the whole layout is taken as short-circuited so that the fraction defective of conductivity failure is reduced compared with the case of the layout including only one fuse section. Also, since the short-circuited fuse section becomes conductive by applying a voltage between the fuse pads, the working time required for the fuse trimming is reduced.

DESCRIPTION OF THE PREFERRED EMBODIMENT

Figure 1A:
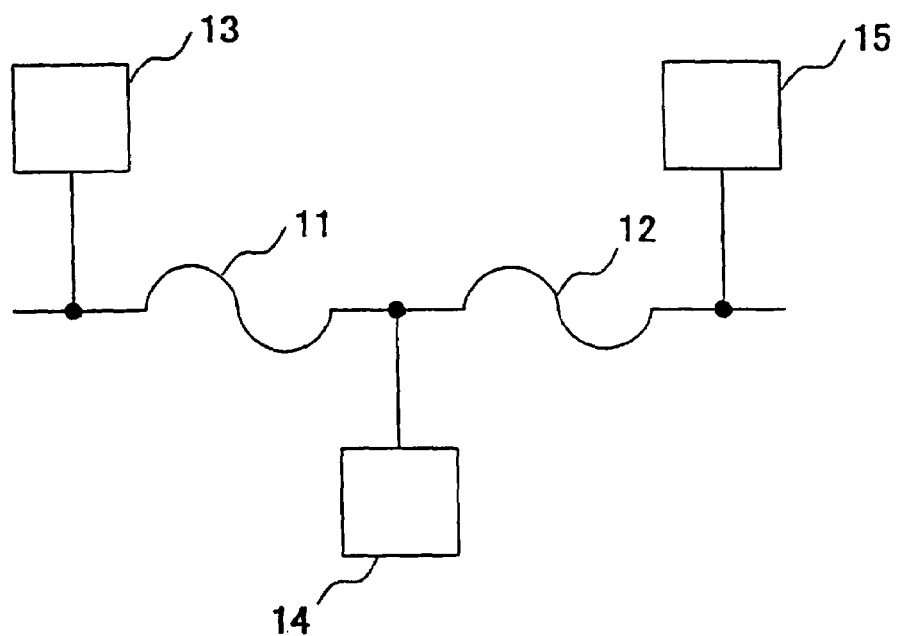
FIG. 1(a) is a schematic circuit diagram of a fuse layout according to the first embodiment of the present invention.

A fuse layout and trimming method according to preferred embodiments of the present invention will now be described with reference to the accompanying drawings. Elements having substantially identical functions are given the same reference numerals and the overlapping description will be omitted.

(First Embodiment)

Figure 1B:
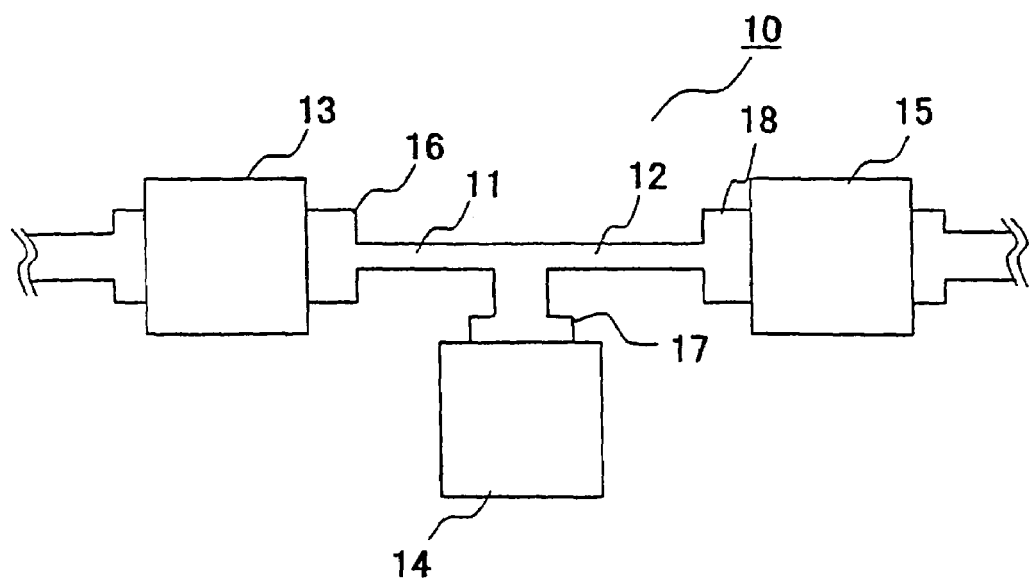
FIG. 1(b) is a top view of the fuse layout of FIG. 1(a).

In FIGS. 1(a) and 1(b), two conventional fusion-type fuses are connected in series. The fuses are generally formed simultaneously when uppermost electrode wiring metal of main elements is formed. The fuse has a two-layer structure including a lower layer or a thin barrier metal layer made of, for example, TiN and an upper layer or a thick electrode metal layer made of, for example, Al. Although the thickness of the respective layers depend upon the kind and process of the elements, the thickness of the electrode metal is generally a few thousand Å and the thickness of the barrier metal is generally as thin as a few tens Å to prevent the reaction of the barrier metal with a diffused layer of the upper metal.

Figure 4:
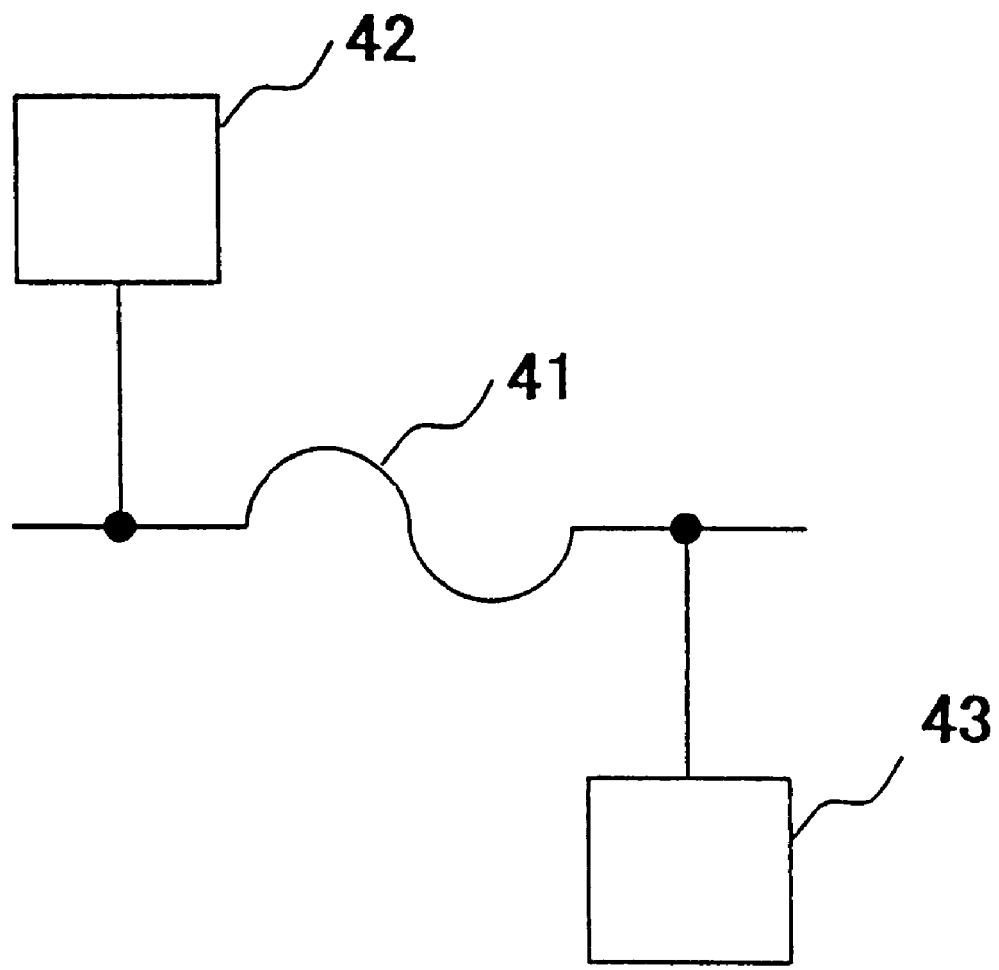
FIG. 4 is a schematic circuit diagram of a fuse layout according to the prior art.

As shown in FIG. 4, a fusion-type fuse according to the prior art comprises a narrow fuse section 41 and two fuse pads 42 and 43 connected to both ends of the fuse section 41. By contrast, a fuse layout 10 according to the first embodiment of the present invention comprises narrow fuse sections 11 and 12 connected to each other in series and fuse pads 13, 14, and 15 for drawing current to the respective fuse sections individually.

The fuse pad 13 is provided at an end of the fuse section 11, the fuse pad 14 is provided between the fuse sections 11 and 12, and the fuse pad 15 is provided at an end of the fuse section 12. Voltages are applied between the fuse pads 13 and 14 and fuse pads 14 and 15 to carry current to the fuse sections 11 and 12, respectively. The two fuse sections and the three fuse pads laid out as described above make a fuse.

The fuse pads 13 and 15 are further connected to an internal circuit. It is preferable that leading sections 16, 17, and 18 are provided at positions to connect the fuse pads and fuse sections to prevent the peeling of the pattern and concentration of electric field upon turning on electricity.

Next, a trimming method using the above laid-out fuse will be described. In the characteristic test of the semiconductor device, pads of main element are probed by a testing apparatus or a prober. When it is found by the result of the characteristic test that cutting of fuse is required, the fuse pads 13 and 14 are probed and a voltage is applied between both the pads so as to draw current at the fuse 11 to the extent that the elements do not receive any influence.

Figure 2:
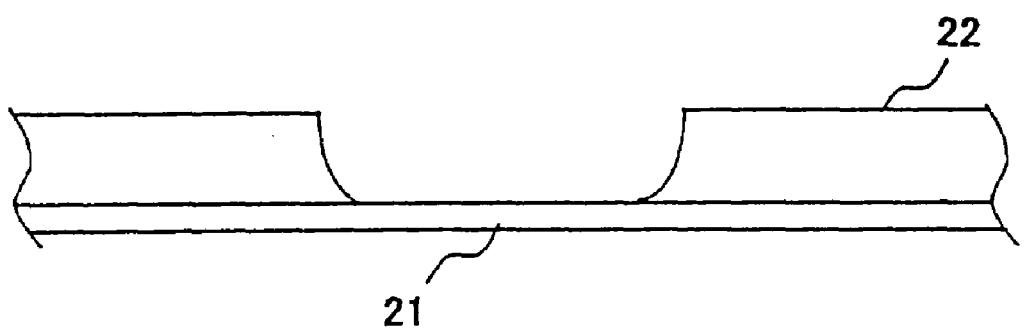
FIG. 2 is a sectional view of the fuse, wherein a barrier metal of a fuse remains.

At this point, the metal of the fuse section 11 is melted by current resulting in cut of the fuse section 11. It is desirable that the wiring metal of the upper layer and the barrier metal of the lower layer are both cut, however, as shown in FIG. 2, although a wiring metal 22 of the upper layer is cut, sometimes a barrier metal 21 of the lower layer is not cut to remain because the resistance of the barrier metal is higher than that of the wiring metal 22.

In the similar way, the fuse pads 14 and 15 are probed and current is drawn at the fuse section 12. In this case too, sometimes the barrier metal is not cut and remains.

When both the fuse sections 11 and 12 are completely cut, the entire layout is also on the condition of "completely cut". When one of the fuse sections 11 and 12 is completely cut and the other is not cut to remain, the entire layout is also on the condition of "completely cut" because the fuse sections 11 and 12 are connected in series.

In this embodiment, each of the fuse sections connected in series is cut individually. Consequently, the total fraction defective of the incomplete cut of the layout is determined by the multiplication of each fraction defective of each barrier metal. Accordingly, the more the number of the fuse sections is, the more the total fraction defective is reduced. In this embodiment, the number of the fuse sections is two, however, if more fuse sections are provided, the total fraction defective is reduced.

When both the fuse sections 11 and 12 are not completely cut, if resistance values of the remaining barrier metals of the fuse sections 11 and 12 are approximately 1 MΩ, respectively, the total resistance value of the layout becomes approximately 2 MΩ because the fuse sections 11 and 12 are connected in series. This total resistance value is sufficiently high to control the leakage current to be sufficiently low so that the fuse is in the same condition as the barrier metal is completely cut. In this case, the more the number of the serially connected fuse sections is, the higher the total resistance value is.

As describe above, it is better to increase the number of the serially connected fuse sections not only to make the total fraction defective of incomplete cut as low as possible but also make the total resistance value of the remaining barrier metals as high as possible. However, increase of the number of the fuse sections requires more time to cut all the fuse sections. Accordingly, the number of the fuse sections should be determined considering the this point.

After cutting the fuse, the characteristic test of the elements is performed again. If the incomplete cut of the fuse is found, the semiconductor device is treated as defective by the trimming error since re-trimming with a higher voltage cannot be performed because it may cause adverse influences on the elements. Accordingly, if the fraction defective of the incomplete cut is reduced, the production yield is increased.

Also, in case of the fuse cut by laser beam, after the characteristic test of the device is performed by a probing tester to determine fuses subject to cutting process, the device is carried to a laser irradiation apparatus, then returned to the probing tester to perform the characteristic test again, thus requiring long working time for the trimming. However, in case of the fuse cut by drawing current, the series of the process including the first characteristic test, fuse cutting, and the second characteristic test can be performed by the probing apparatus so that the working time for the trimming is extremely reduced.

As fully described above, in the fusion-type fuse including a plurality of fuse sections connected to each other in series, a fuse pad is provided to draw current to the respective fuse sections so that the total fraction defective of the fuse layout is reduced or the total resistance value of the fuse layout is increased even when the fuse is not completely cut. In addition, the working time for the trimming is reduced.

(Second Embodiment)

The layout of the second embodiment comprises a plurality of fuse sections connected in series in the same way as the first embodiment. However, the fuse sections are cut by irradiation of laser beam so that no pad for drawing current to the fuse sections is required.

When the fuse section is cut by the irradiation of laser beam, an electrode metal may not be cut completely and remain at an end of the fuse section if the irradiation of laser beam is inaccurate, regardless the kind and structure of the electrode metal. When the metal remains after the first trial, the second trial by the irradiation of laser beam cannot be performed for the reason of possible damage on the vicinity of the fuse section. Accordingly, if the fuse section is not cut completely by the first trial, the device is treated as defective by the reason of fuse trimming error.

For the same reason as the first embodiment, the total fraction defective of the incomplete cut of the fuse layout is reduced by individually cutting each of a plurality of fuse sections connected in series, thereby to increase the yield and reliability of the device.

(Third Embodiment)

Figure 3:
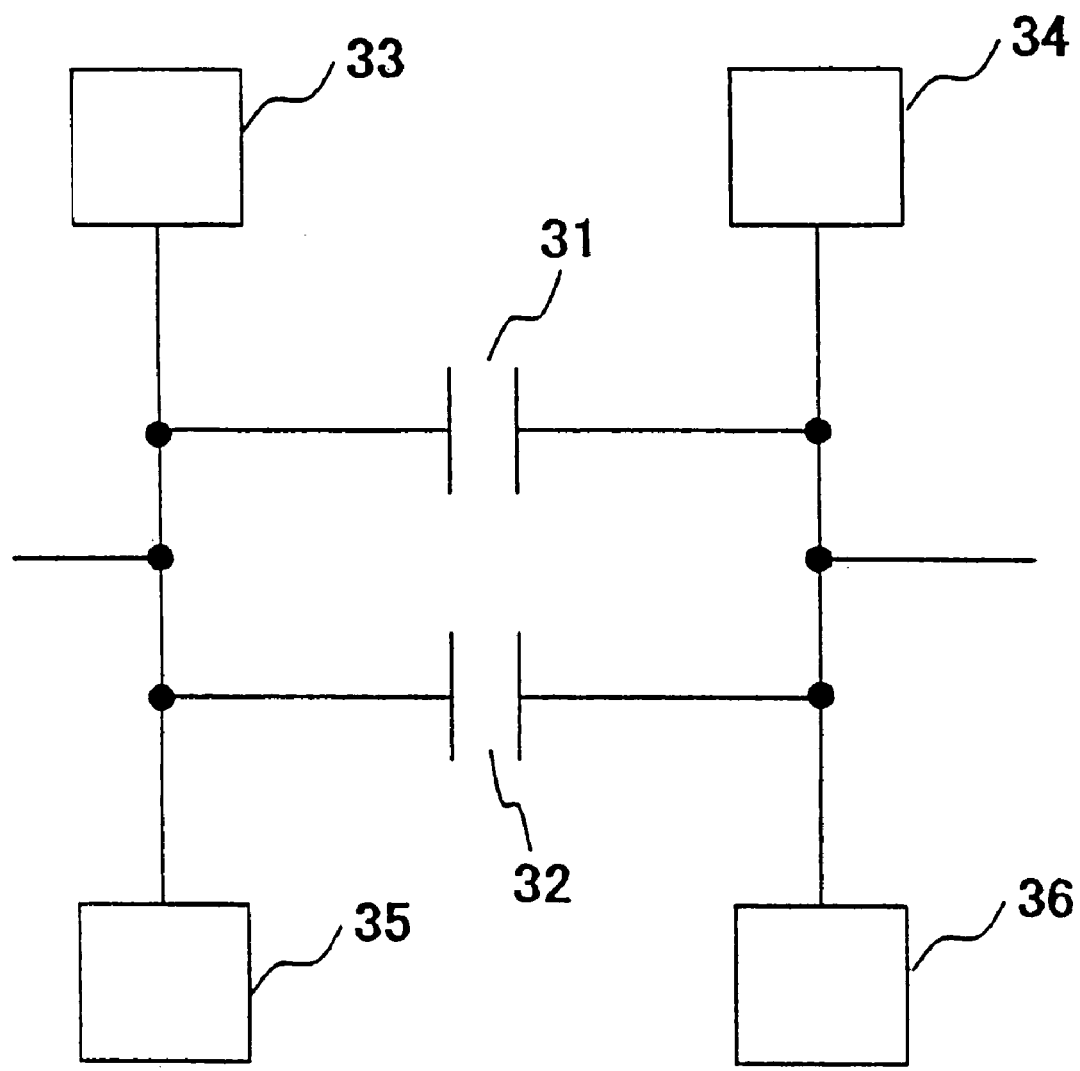
FIG. 3 is a schematic circuit diagram of a fuse layout according to the third embodiment of the present invention.

In FIG. 3, two short-circuited type fuse sections 31 and 32 having a conventional capacitor structure are connected to each other in parallel. Fuse pads 33 and 34 are provided for applying a voltage to the fuse section 31 and fuse sections 35 and 36 are provided for applying a voltage to the fuse section 32. A layout including the above elements constructs a fuse.

The short-circuited type fuse has a structure where an interlayer, such as a silicon oxide layer, is sandwiched by electrode wiring metals. The short-circuited type fuse is electrically open before turning on electricity but short-circuited between both the metals when the interlayer is electrically broken down by application of a voltage between the metals.

It is desirable that the interlayer is completely broken down for complete short-circuit, however, sometimes there is no conductivity between the metals or sometimes the conductivity is not complete. Especially, when the conductivity is not complete, the device may pass the characteristic test but become defective at the reliability test including a thermal cycle test, because the conductivity is lost by the peeling of the metals. It reduces the reliability.

If a plurality of short-circuited type fuse sections are connected to each other in parallel and electrically broken down by applying a voltage between the fuse pads, the total fraction defective of conductivity failure of the entire layout is determined by the multiplication of each fraction defective of the conductivity failure of each fuse section. Accordingly, the total fraction defective is reduced to large extent, resulting in increase of the yield and reliability of the device.

In FIG. 3, the number of the fuse sections connected in parallel is two, however, the more the number of the fuse sections is, the more the total fraction defective is reduced. In addition, since the short-circuit of the fuse section by applying a voltage is performed at the time of probing simultaneously with the characteristic test, the working time for the trimming is extremely reduced.

As described above, in the short-circuited type fuse including a plurality of fuse sections connected to each other in parallel, fuse pads are provided to apply a voltage to the respective fuse sections so that the total fraction defective of the conductivity failure of the fuse layout is reduced to large extent, which increases the reliability and the reduce the working time for the trimming.

The preferred embodiments of the fuse layout and the trimming method according to the present invention have been described, however, the present invention is not limited to the above embodiments. Various changes and modifications are considerable within the technical concept of the claimed invention and these changes and modifications should belong to the technical scope of the present invention.

According to the present invention in the fusion-type fuse including a plurality of fuse sections connected to each other in series, fuse pads are provided to draw current to the respective fuse sections so that the total fraction defective of the incomplete cut of the fuse layout is extremely reduced. Even when the fuse is not completely cut, the total resistance value of the fuse layout is increased, which can be considered the same condition as the complete cut of the fuse. Moreover, the working time for the trimming is reduced to large extent because the trimming is performed in the probing process with the characteristic test.

The invention claimed is:

1. A fuse layout formed of a wiring electrode made of a barrier metal layer of a high melting point and a main wiring metal layer, said fuse layout comprising:
    a single conductive path connected between two nodes;
    a plurality of fuse sections connected to each other in series and arranged in the single conductive path, said fuse sections being formed on a substrate of a semiconductor device; and
    a plurality of fuse pads electrically connected to the fuse sections alternately in series for drawing current to respective fuse sections, the plurality of fuse pads including at least one fuse pad electrically connected only to the conductive path.

2. The fuse layout according to claim 1, wherein said barrier metal layer is a thin layer formed under said main wiring metal layer.

3. The fuse layout according to claim 2, wherein said fuse sections and fuse pads are connected to each other through a plurality of leading sections.

4. A trimming method using said fuse layout according to claim 3, said trimming method comprising the step of:
    cutting said fuse sections by applying a voltage between said fuse pads to draw current to said respective fuse sections.

5. A trimming method using said fuse layout according to claim 2, said trimming method comprising the step of:
    cutting said fuse sections by applying a voltage between said fuse pads to draw current to said respective fuse sections.

6. The fuse layout according to claim 1, wherein said fuse sections and fuse pads are connected to each other through a plurality of leading sections.

7. A trimming method using said fuse layout according to claim 6, said trimming method comprising the step of:
    cutting said fuse sections by applying a voltage between said fuse pads to draw current to said respective fuse sections.

8. A trimming method using said fuse layout according to claim 1, said trimming method comprising the step of:
    cutting said fuse sections by applying a voltage between said fuse pads to draw current to said respective fuse sections.

9. The fuse layout according to claim 1, wherein said fuse sections are arranged to form a single fuse unit so that the single fuse unit is disconnected when at least one of the fuse sections is disconnected.

10. The fuse layout according to claim 1, further comprising a leading section disposed between at least one of the fuse pads and at least one of the fuse sections, said leading section having a width between a width of the at least one of the fuse pads and a width of the at least one of the fuse sections.

11. A fuse layout comprising:
a first node formed on a substrate of a semiconductor device;
a second node formed on the substrate of the semiconductor device;
a single conductive path connected between the first node and the second node;
a first fuse section having two first end portions arranged in the single conductive path;
a second fuse section having two second end portions arranged in the single conductive path, one of said two second end portions being connected to one of the two first end portions so that the first fuse section and the second fuse section are connected in series;
a first fuse pad electrically connected to the other of the two first end portions;
a second fuse pad disposed between the first fuse section and the second fuse section such that the second fuse pad is electrically connected to the one of the two first end portions and the one of the two second end portions; and
a third fuse pad electrically connected to the other of the two second end portions.

12. A trimming method using said fuse layout according to claim 11, said trimming method comprising the step of:
cutting at lease one of the first fuse section and the second fuse section by applying a voltage between respective fuse pads.

13. The fuse layout according to claim 11, wherein said first fuse section and said second fuse section are arranged to form a single fuse unit so that the single fuse unit is disconnected when at least one of the first fuse section and the second fuse section is disconnected.

14. The fuse layout according to claim 11, further comprising a leading section disposed between at least one of the first fuse pad, the second fuse pad, and the third fuse pad, and at least one of the first fuse section and the second fuse section, said leading section having a width between a width of the at least one of the first fuse pad, the second fuse pad, and the third fuse pad, and a width of the at least one of the first fuse section and the second fuse section.

* * * * *